United States Patent
Park et al.

(10) Patent No.: US 9,462,688 B2
(45) Date of Patent: Oct. 4, 2016

(54) FLEXIBLE METAL LAMINATE CONTAINING FLUOROPOLYMER

(75) Inventors: Young-Seok Park, Daejeon (KR); Soon-Yong Park, Daejeon (KR); Se-Myung Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/605,719

(22) Filed: Sep. 6, 2012

(65) Prior Publication Data

US 2013/0065018 A1 Mar. 14, 2013

(30) Foreign Application Priority Data

Sep. 7, 2011 (KR) .................. 10-2011-0090825
Sep. 6, 2012 (KR) .................. 10-2012-0098872

(51) Int. Cl.
*H05K 1/03* (2006.01)
*B32B 37/24* (2006.01)
(Continued)

(52) U.S. Cl.
CPC ......... *H05K 1/036* (2013.01); *B32B 2037/243* (2013.01); *B32B 2255/06* (2013.01); *B32B 2255/26* (2013.01); *B32B 2255/28* (2013.01); *B32B 2311/00* (2013.01); *B32B 2327/12* (2013.01); *B32B 2379/08* (2013.01); *H05K 1/024* (2013.01); *H05K 1/0393* (2013.01); *H05K 3/022* (2013.01); *Y10T 428/24355* (2015.01); *Y10T 428/24975* (2015.01); *Y10T 428/264* (2015.01);
(Continued)

(58) Field of Classification Search
CPC ...... H05K 1/036; H05K 1/024; H05K 3/022; H05K 1/0393; B32B 2255/06; B32B 2255/28; B32B 2379/08; B32B 2037/243; B32B 2311/00; B32B 2327/12

USPC ......... 156/278; 427/388; 428/141, 216, 335, 428/421, 422, 458, 473.5
See application file for complete search history.

(56) References Cited

U.S. PATENT DOCUMENTS

| 4,816,516 A | 3/1989 | Yamaya et al. |
| 7,026,032 B2 | 4/2006 | Lee et al. |

(Continued)

FOREIGN PATENT DOCUMENTS

| CN | 1313361 A | 9/2001 |
| CN | 1555312 A | 12/2004 |

(Continued)

OTHER PUBLICATIONS

English language abstract of JP 07-026128, 1 page.
(Continued)

*Primary Examiner* — Maria Veronica Ewald
*Assistant Examiner* — Brian Handville
(74) *Attorney, Agent, or Firm* — Rothwell, Figg, Ernst & Manbeck, P.C.

(57) ABSTRACT

The present invention relates to a flexible metal laminate with low dielectric constant, which may be applied for a substrate for a flexible printed circuit. A flexible metal laminate according to one aspect of the invention includes a first metal layer; a first polyimide layer; a polyimide layer including fluoropolymer dispersed therein, formed on the first polyimide layer; and a second polyimide layer formed on the polyimide layer including fluoropolymer dispersed therein; wherein in the polyimider layer including dispersed fluoropolymer, the content of the fluoropolymer per unit volume is higher at 40 to 60% depth than at 5 to 10% depth of the total thickness from the surface of the polyimide layer.

11 Claims, 3 Drawing Sheets

(51) Int. Cl.
*H05K 1/02* (2006.01)
*H05K 3/02* (2006.01)

(52) U.S. Cl.
CPC ... *Y10T 428/3154* (2015.04); *Y10T 428/31544* (2015.04); *Y10T 428/31681* (2015.04); *Y10T 428/31721* (2015.04)

(56) References Cited

U.S. PATENT DOCUMENTS

| 2006/0003168 | A1* | 1/2006 | Dadalas et al. | 428/421 |
| 2007/0042202 | A1* | 2/2007 | Park et al. | 428/458 |
| 2007/0066741 | A1* | 3/2007 | Donovan et al. | 524/430 |
| 2012/0107689 | A1* | 5/2012 | Takahashi et al. | 429/217 |

FOREIGN PATENT DOCUMENTS

| CN | 1764534 A | 4/2006 |
| CN | 101006148 A | 7/2007 |
| EP | 1221732 A2 | 7/2002 |
| JP | 56-7490 A | 1/1981 |
| JP | 61-53131 U | 4/1986 |
| JP | 63-224934 A | 9/1988 |
| JP | H0433394 A | 2/1992 |
| JP | 07-26128 U | 5/1995 |
| JP | 2501331 B2 | 3/1996 |
| JP | 4237694 B2 | 12/2008 |
| JP | 2010-285535 A | 12/2010 |
| JP | 2011-051203 A | 3/2011 |
| KR | 10-2004-0015235 A | 2/2004 |
| KR | 10-2005-0106538 A | 11/2005 |
| KR | 10-0572094 B1 | 4/2006 |
| KR | 10-0767208 B1 | 10/2007 |
| KR | 10-0993063 B1 | 11/2010 |
| KR | 10-2011-0007243 A | 1/2011 |
| TW | 200609314 A | 3/2006 |
| TW | 201105712 A | 2/2011 |
| WO | 2007/049502 A1 | 5/2007 |
| WO | WO2012002037 A1 * | 1/2012 |

OTHER PUBLICATIONS

English translation of claim 1 of JP 2501331, 1 page.
Office Action issued in Taiwanese Patent Appln. No. 101132691 on Mar. 25, 2014 along with English translation, 14 pages.
Xu Yi, "Adjuvants for Synthesis of Macromolecules," Chemical Industry Press, Mar. 2002, p. 194.

* cited by examiner

FLEXIBLE METAL LAMINATE CONTAINING FLUOROPOLYMER

CROSS REFERENCE TO RELATED APPLICATIONS

This application claims priority from Korean Patent Application No. 10-2012-0098872 filed on Sep. 6, 2012, and claims priority from Korean Patent Application No. 10-2011-0090825 filed on Sep. 7, 2011, all of which are incorporated herein by reference in their entireties for all purposes.

FIELD OF THE INVENTION

The present invention relates to a flexible metal laminate containing fluoropolymer. More specifically, the present invention relates to a flexible metal laminate that may be applied for a flexible printed circuit.

BACKGROUND OF THE INVENTION

A flexible metal laminate is mainly used as a substrate of a flexible printed circuit board, and it is also used as flat heating element electromagnetic shield material, flat cable, package material, and the like. Among the flexible metal laminates, a flexible copper clad laminate consists of a polyimide layer and a copper foil layer, and it is divided into an adhesive type and a non-adhesive type according to the existence of an epoxy adhesive layer between the polyimide layer and the copper foil layer. The non-adhesive flexible copper foil laminate is formed by direct adhesion of polyimide to the surface of the copper foil, and with the recent tendency of miniaturization and slimming of electronics, and requirement for excellent ion migration, the non-adhesive flexible copper clad laminate is predominantly used.

And, with the tendency of miniaturization, high speed and combination of various functions of electronics, there has been a demand for improving signal transduction speed of electronic device. Thus, there is a demand for development of a printed circuit board using insulator having lower dielectric constant and dielectric loss than the existing insulator. Recently, reflecting the tendency, there have been attempts to use liquid crystalline polymer (LCP), which is an insulator having lower dielectric constant than the existing polyimide and is influenced little by moisture absorption, in a flexible printed circuit board. However, dielectric constant of LCP (Dk=2.9) is less excellent than dielectric constant of polyimide (Dk=3.2), it has too low heat resistance, and it has low compatibility with a PCB manufacturing process using the existing polyimide. Therefore, studies on lowering dielectric constant of polyimide have been progressed.

For example, U.S. Pat. No. 4,816,516 describes technology of manufacturing molded product by mixing polyimide and fluorine-containing polymer. However, it has limitation that it directly uses polyimide having high coefficient of thermal expansion and low Tg (glass transition temperature). And, to use for a printed circuit board, it is required to be manufactured in the form of a thin film, but the above patent does not mention a metal laminate in the form of a thin film. And, U.S. Pat. No. 7,026,032 describes a method of lowering dielectric constant by dispersing fluoropolymer fine powder in polyimide. However, it has problems in that adhesion to a coverlay or adhesion to prepreg decreases. And, since CTE values in the Examples of the above patent are too large, it has a limitation for use as a flexible metal laminate. Moreover, since fluoropolymer is exposed on the surface, the fluoropolymer is dissolved during a high temperature storage process, thus causing a risk of delamination of copper foil circuit from an insulator.

DETAILED DESCRIPTION OF THE INVENTION

Technical Problem

It is an object of the invention to provide a flexible metal laminate that exhibits low dielectric constant and simultaneously has excellent applicability as a printed circuit board.

Technical Solution

A flexible metal laminate according to one aspect of the invention includes a first metal layer; a first polyimide layer; a polyimide layer including fluoropolymer dispersed therein, formed on the first polyimide layer; and a second polyimide layer formed on the polyimide layer including fluoropolymer dispersed therein; wherein in the polyimide layer including dispersed fluoropolymer, the content of the fluoropolymer per unit volume is higher at 40 to 60% depth than at 5 to 10% depth of the total thickness from the surface of the polyimide layer.

The polyimide layer including dispersed fluoropolymer may have the lowest content of the fluoropolymer per unit volume at 5 to 10% depth of the total thickness from the surface of the polyimide layer.

And, the polyimide layer including dispersed fluoropolymer may have the highest content of the fluoropolymer per unit volume at 40 to 60% depth of the total thickness from the surface of the polyimide layer.

And, in the polyimide layer including dispersed fluoropolymer, the content of the fluoropolymer per unit volume may gradually increase with depth, at 5 to 15% depth of the total thickness from the surface of the polyimide layer.

The flexible metal laminate may further include a second metal layer formed on the second polyimide layer The surface of the first metal layer and the surface of the second metal layer may respectively have ten point average roughness (Rz) of 0.5 to 2.5 um.

And, the first polyimide layer and the second polyimide layer may respectively have a thickness of 1 to 10 um.

And, the polyimide layer including dispersed fluoropolymer may have a thickness of 5 to 50 um.

The fluoropolymer may be at least one selected from the group consisting of polytetrafluoroethylene (PTEF), perfluoroalkoxy (PFA), fluorinated ethylene propylene (FEP), chlorotrifluoroethylene (CTFE), tetrafluoroethylene/chlorotrifluoroethylene (TFE/CTFE), ethylene chlorotrifuloroethylene (ECTFE), and polyfluorinated vinylidene (PVDF).

Furthermore, the fluoropolymer may be included in the content of 10 to 60 wt % in the polyimide layer including dispersed fluoropolymer.

And, the polyimide layers including the first polyimide layer, the polyimide layer including dispersed fluoropolymer, and the second polyimide layer may have dielectric constant of 2.2 to 3.2 at 1 MHz, dielectric loss of 0.001 to 0.007, and thermal expansion coefficient of to 15 to 35 ppm/K.

And, the first metal layer and the second metal layer may be thin films of one kind selected from the group consisting of copper, iron, nickel, titanium, aluminum, silver and gold, or an alloy of two or more kinds thereof.

A method for manufacturing a flexible metal laminate according to another aspect of the invention includes: coating a first polyamic acid varnish on a first metal layer; coating polyamic acid varnish including fluoropolymer powder dispersed therein on the first polyamic acid varnish; and coating a second polyamic acid varnish on the polyamic acid varnish including fluoropolymer powder dispersed therein, drying and curing it.

The method may further include a step of laminating a second metal layer on a polyimide layer formed by curing the second polyamic acid varnish.

And, the first polyamic acid varnish and the second polyamic acid varnish may be prepared by agitating a mixture including aromatic tetracarboxylic anhydride, aromatic diamine, and an organic solvent.

The aromatic tetracarboxylic anhydride may be at least one selected from the group consisting of pyromellitic dianhydride (PMDA), biphenyl-tetracarboxylic acid dianhydride (BPDA), 4,4'-Benzophenonetetracarboxylic Dianhydride (BTDA), 4,4'-Oxydiphthalic anhydride (ODPA), 4,4'-(Hexafluoroisopropylidene)diphthalic Anhydride (6FDA), and 4,4'-(4,4'-isopropylidene-diphenoxy) bis(phthalic anhydride) (BPADA).

The aromatic tetracarboxylic anhydride may be included in the equivalents of 0.90 to 1.10 of the aromatic diamine.

The aromatic diamine may be at least one selected from the group consisting of phenylenediamine(PDA), oxydianiline (ODA), o-phenylenediamine (OPD), Meta phenylene Diamine (MPD), 1,3-bis(4-aminophenoxy)benzene (TPER), 4,4'-bis(4-aminophenoxy)benzene (TPEQ), 2,2'-Dimethyl-4,4'-diamino biphenyl (m-TB-HG), 2,2'-Bis(Trifluoromethyl) benzidine (TFDB), 1,3'-Bis(3-aminophenoxy)benzene (APBN), 3,5-Diaminobenzotrifluoride(DABTF), and 2,2-bis(4-[4-aminophenoxy]-phenyl)propane(BAPP).

The organic solvent may be at least one selected from the group consisting of N,N-dimethylformamide, N,N-dimethylacetamide, N,N-diethylacetamide, N,N-dimethylmethoxyacetamide, N-methyl-2-pyrrolidone, N-methylcaprolactam, 1,3-dimethyl-2-imidazolidone, 1,2-dimethoxyethane, 1,3-dioxane, 1,4-dioxane, pyridine, picoline, dimethylsulfoxide, dimethylsulfone, m-cresol, p-chlorophenol, and anisole.

The organic solvent may be included in the content of 70 to 90 wt %, based on the total weight of the polyamic acid varnish.

And, the polyamic acid varnish including fluoropolymer powder dispersed therein may be prepared by dispersing fluoropolymer powder in an organic solvent using a polyester-based dispersant, and then, adding a mixture including aromatic tetracarboxylic anhydride and aromatic diamine, and agitating it.

The fluoropolymer powder may have average particle diameter of 0.1 to 10.0 um.

The drying may be conducted at 100 to 200° C.

The curing may be conducted at 300 to 400° C. for 5 to 30 minutes.

And, the laminating of the second metal layer may be conducted at 300 to 400° C.

The first metal layer and the second metal layer may be thin films of one kind selected from the group consisting of copper, iron, nickel, titanium, aluminum, silver and gold, or an alloy of two or more kinds thereof.

The flexible metal laminate according to the present invention has a structure wherein polyimide layers are formed on both sides of a polyimide layer including fluoropolymer dispersed therein, thereby increasing adhesion to a metal layer while improving dielectric property and inhibiting surface precipitation of fluoropolymer.

And, since the polyimide layer including dispersed fluoropolymer uses a polyester-based dispersant, fluoropolymer may be uniformly dispersed thus improving heat resistance and optimizing thermal expansion coefficient.

Furthermore, the flexible metal laminate according to the present invention has low dielectric constant, low dielectric loss, and low water absorption, while having properties of the existing polyimide insulator including high heat resistance, high chemical resistance, high flexibility, and dimensional stability.

EXAMPLES

Figure 1:
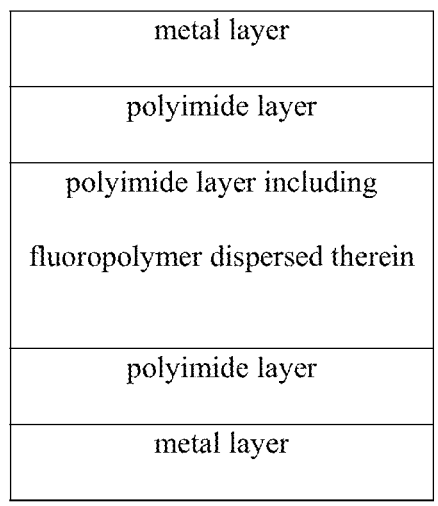
FIG. 1 is a cross-sectional view of the flexible metal laminate according to one embodiment of the invention.

The present invention will be explained in detail with reference to specific examples and drawings. However, it is to be understood that the invention is not limited to the disclosed embodiments, but, on the contrary, is intended to cover various modifications and equivalent arrangements included within the spirit and scope of the appended claims.

The present invention provides a flexible metal laminate comprising: a first metal layer; a first polyimide layer; a polyimide layer including fluoropolymer dispersed therein, formed on the first polyimide layer; and a second polyimide layer formed on the polyimide layer including fluoropolymer dispersed therein; wherein in the polyimide layer including dispersed fluoropolymer, the content of the fluoropolymer per unit volume is higher at 40 to 60% depth than at 5 to 10% depth of the total thickness from the surface of the polyimide layer.

The present invention also provides a method for manufacturing a flexible metal laminate comprising: coating a first polyamic acid varnish on a first metal layer; coating polyamic acid varnish including fluoropolymer powder dispersed therein on the first polyamic acid varnish; and coating a second polyamic acid varnish on the polyamic acid varnish including fluoropolymer powder dispersed therein, drying and curing it.

Hereinafter, a flexible metal laminate and a manufacturing method thereof according to specific embodiments of the invention will be explained in detail.

According to one embodiment of the invention, there is provided a flexible metal laminate comprising: a first metal layer; a first polyimide layer; a polyimide layer including fluoropolymer dispersed therein, formed on the first polyimide layer; and a second polyimide layer formed on the polyimide layer including fluoropolymer dispersed therein; wherein in the polyimider layer including dispersed fluoropolymer, the content of the fluoropolymer per unit volume is higher at 40 to 60% depth than at 5 to 10% depth of the total thickness from the surface of the polyimide layer.

The flexible metal laminate has a structure wherein fluoropolymer is not dispersed in the polyimide layers contacting the metal layer, and is dispersed in a middle layer of the polyimide layer. Due to the fluoropolymer, dielectric property may be improved, and due to both side layers that do not include fluoropolymer, adhesion to the metal layer may be improved, and surface precipitation of fluoropolymer may be inhibited. And, since both side layers are formed of polyimide, electrical property including migration, and the like may become excellent.

Specifically, unlike the prior art where the content of fluoropolymer per unit volume increases at the surface, the content of fluoropolymer per unit volume relatively decreases within about 5 to 10% depth of total thickness from the surface, and the content of fluoropolymer per unit volume relatively increases at a middle part, for example, at 40 to 60% depth of total thickness from the surface.

Therefore, precipitation of fluoropolymer on the surface of the polyimide layer may be inhibited to effectively achieve low dielectric constant by inclusion of fluoropolymer, and inhibit degradation of adhesion between polyimide layers or delamination due to surface precipitation of fluoropolymer. And, degradation of heat resistance of the polyimide layer or flexible metal laminate due to surface precipitation of fluoropolymer may be inhibited.

As explained, since polyimide layers are formed on both sides, discharge of fluoropolymer to the surface is prevented, and uniform dispersion of fluoropolymer is enabled by the use of a dispersant. Thus, in the middle layer of the polyimide layer including fluoropolymer dispersed therein, the content of fluoropolymer per unit volume may be higher at about 40 to 60% depth, or about 45 to 55% depth, than about 5 to 10% depth of total thickness from the surface of the polyimide layer, the content of fluoropolymer per unit volume may be the lowest at about 5 to 10% depth of total thickness from the surface of the polyimide layer, the content of fluoropolymer per unit volume may be the highest at about 40 to 60% depth of total thickness from the surface of the polyimide layer, and the content of fluoropolymer per unit volume may gradually increase with depth at about 5 to 15% depth of total thickness from the surface of the polyimide layer.

Meanwhile, according to one embodiment of the invention, the flexible metal laminate may further include a second metal layer formed on the second polyimide layer. The flexible metal laminate is a single side flexible metal laminate having one metal layer, and in case it further includes a second metal layer formed on the second polyimide layer, it becomes a double side flexible metal laminate.

According to one embodiment of the invention, the surface of the first metal layer and the surface of the second metal layer may respectively have ten point average roughness (Rz) of about 0.5 to 2.5 um, or about 1 to 2 um. If average roughness (Rz) is less than about 0.5 um, adhesion to the polyimide layer may become low, and if it is greater than about 2.5 um, surface roughness may increase to increase transmission loss at high frequency.

And, the first polyimide layer and the second polyimide layer may respectively have a thickness of about 1.0 to 10 um, or about 2.0 to 9 um. If the thickness of the first polyimide layer or the second polyimide layer is less than about 1.0 um, adhesion to a metal layer may become low, and if it is greater than about 10.0 um, the thickness of the polyimide layer including dispersed fluoropolymer may become relatively thin, and thus, it may be difficult to achieve low dielectric constant of the polyimide layer.

And, the polyimide layer including dispersed fluoropolymer may have a thickness of about 5 to 50 um, or about 10 to 45 um, or about 15 to 40 um. If the thickness of the polyimide layer including dispersed fluoropolymer is less than about 5 um, the thickness of the polyimide layer having low dielectric constant may become relatively thin, and thus, it may be difficult to achieve low dielectric constant of total polyimide layer, and if it is greater than about 50 um, it may be difficult to progress a curing process in the manufacturing process.

And, the fluoropolymer may be at least one selected from the group consisting of polytetrafluoroethylene (PTEF), perfluoroalkoxy (PFA), fluorinated ethylene propylene (FEP), chlorotrifluoroethylene (CTFE), tetrafluoroethylene/chlorotrifluoroethylene (TFE/CTFE), ethylene chlorotrifluoroethylene (ECTFE), and polyfluorinated vinylidene (PVDF).

Furthermore, the fluoropolymer may be included in the content of about 10 to 60 wt %, or about 20 to 50 wt %, in the polyimide layer including dispersed fluoropolymer. If the fluoropolymer is used in the content of less than about 10 wt %, desired degree of low dielectric constant may not be obtained, and if it is used in the content of greater than about 60 wt %, a film may be easily torn or broken.

And, the polyimide layers including the first polyimide layer, the polyimide layer including dispersed fluoropolymer, and the second polyimide layer may have dielectric rate of 2.2 to 3.2 or 2.5 to 2.9 at 1 MHz, dielectric loss of 0.001 to 0.007, and thermal expansion coefficient of to 15 to 35 ppm/K.

And, the first metal layer and the second metal layer may be thin films of one kind selected from the group consisting of copper, iron, nickel, titanium, aluminum, silver and gold, or an alloy of two or more kinds thereof. Preferably, the metal layer may be a copper thin film, namely a copper foil that has excellent electric conductivity and is inexpensive.

According to one embodiment of the invention, there is provided a method for manufacturing a flexible metal laminate comprising: coating a first polyamic acid varnish on a first metal layer; coating polyamic acid varnish including fluoropolymer powder dispersed therein on the first polyamic acid varnish; and coating a second polyamic acid varnish on the polyamic acid varnish including fluoropolymer powder dispersed therein, drying and curing it.

As explained, according to the present invention, polyimide is not directly used, and polyimide is formed through coating and curing using polyamic acid varnish. And, two kinds of polyamic acid varnishes are used. The first polyamic acid varnish and the second polyamic acid varnish function for improving adhesion to a metal layer, and polyamic acid varnish including dispersed fluoropolymer powder is coated between the first polyamic acid varnish and the second polyamic acid varnish.

The polyamic acid varnish including dispersed fluoropolymer powder may be prepared by dispersing fluoropolymer powder in an organic solvent using a polyester-based dispersant, and then, adding a mixture of aromatic tetracarboxylic anhydride and aromatic diamine, and agitating it.

In the manufacturing method according to another aspect of the invention, a flexible metal laminate according to one aspect of the invention including first and second polyimide layers, and a polyimide layer including fluoropolymer dispersed therein may be formed by coating the first and second polyamic acid varnish on both sides of polyamic acid varnish including dispersed fluoropolymer powder, and then, drying and curing it.

Therefore, in the drying or curing process, the first and second polyamic acid varnish may effectively inhibit surface precipitation of fluoropolymer powder on both sides of polyamic acid varnish including dispersed fluoropolymer powder by heat. Specifically, by laminating as the 3-layer structure, the polyimide layers of both sides may inhibit discharge of fluoropolymer of the middle layer on the surface by surface energy difference.

And, by selectively using a polyester-based dispersant, fluoropolymer powder may be more uniformly dispersed in the polyamic acid varnish, thus more effectively inhibiting surface precipitation of fluoropolymer powder.

As the result, a flexible metal laminate according to one aspect of the invention wherein the content of fluoropolymer per unit volume is higher at a middle part of the polyimide layer, for example, at 40 to 60% depth of total thickness from the surface may be obtained.

Hereinafter, a method for manufacturing a flexible metal laminate will be explained. The method for manufacturing a flexible metal laminate may further include a step of laminating a second metal layer on a polyimide layer formed by curing the second polyamic acid varnish. The method manufactures a single side flexible metal laminate having one metal layer, and in case a second metal layer formed on the second polyimide layer is further included, a double side flexible metal laminate may be manufactured.

According to one embodiment of the invention, the first polyamic acid varnish and the second polyamic acid varnish may be formed by reacting aromatic tetracarboxylic anhydride, and aromatic diamine in an organic solvent. The aromatic tetracarboxylic anhydride and aromatic diamine forms a polyimide layer through curing.

The aromatic tetracarboxylic anhydride may be at least one selected from the group consisting of pyromellitic dianhydride (PMDA), biphenyl-tetracarboxylic acid dianhydride (BPDA), 4,4'-Benzophenonetetracarboxylic Dianhydride (BTDA), 4,4'-Oxydiphthalic anhydride (ODPA), 4,4'-(Hexafluoroisopropylidene)diphthalic Anhydride (6FDA), and 4,4'-(4,4'-isopropylidene-diphenoxy)bis (phthalic anhydride)(BPADA).

The aromatic tetracarboxylic anhydride may be included in the equivalents of about 0.90 to 1.10 of the aromatic diamine, preferably in the equivalents of about 0.95 to 1.05, more preferably about 0.96 to 1.00.

The aromatic diamine may be at least one selected from the group consisting of phenylenediamine(PDA), oxydianiline (ODA), o-phenylenediamine (OPD), Meta phenylene Diamine (MPD), 1,3-bis(4-aminophenoxy)benzene (TPER), 4,4'-bis(4-aminophenoxy)benzene (TPEQ), 2,2'-Dimethyl-4,4-diamino biphenyl (m-TB-HG), 2,2'-Bis(Trifluoromethyl) benzidine (TFDB), 1,3'-Bis(3-aminophenoxy)benzene (APBN), 3,5-Diaminobenzotrifluoride(DABTF), and 2,2-bis(4-[4-aminophenoxy]-phenyl)propane(BAPP).

The organic solvent is not specifically limited, but it may be at least one selected from the group consisting of N,N-dimethylformamide, N,N-dimethylacetamide, N,N-diethyl-acetamide, N,N-dimethylmethoxyacetamide, N-methyl-2-pyrrolidone, N-methylcaprolactam, 1,3-dimethyl-2-imidazolidone, 1,2-dimethoxyethane, 1,3-dioxane, 1,4-dioxane, pyridine, picoline, dimethylsulfoxide, dimethylsulfone, m-cresol, p-chlorophenol, and anisole And, the organic solvent may be included in the content of about 70 to 90 wt %, or about 75 to 85 wt %, based on the total weight of the polyamic acid varnish.

And, the polyamic acid varnish including fluoropolymer powder dispersed therein may be prepared by dispersing fluoropolymer powder in an organic solvent using a polyester-based dispersant, and then, adding a mixture including aromatic tetracarboxylic anhydride and aromatic diamine, and agitating it. Due to the use of the polyester-based dispersant in the polyimide layer including fluoropolymer dispersed therein, fluoropolymer may be uniformly dispersed to improve heat resistance and optimize thermal expansion coefficient.

And, the fluoropolymer powder may have average particle diameter of about 0.1 to 10.0 um, preferably about 0.1 to 7.0 um, more preferably about 0.1 to 5.0 um. If the average particle diameter is less than about 0.1 um, surface area of fluoropolymer powder may increase and thus dispersibility may not be good, and if it is greater than about 10 um, agglomerated fluoropolymer powder may appear in the polyimide layer.

The drying may be conducted at about 100 to 200° C. , and the curing may be conducted at about 300 to 400° C. for about 5 to 30 minutes. By the curing, polyamic acid is changed to polyimide thus manufacturing a flexible metal laminate.

And, the lamination of the second metal layer may be conducted by high temperature lamination, and it may be conducted at about 300 to 400° C.

Hereinafter, preferable examples will be explained in detail referring to accompanied drawings. However, these examples are only to illustrate the invention, and the scope of the invention is not limited thereto.

Example 1

Preparation of Polyamic Acid Varnish Including Fluoropolymer Powder Dispersed Therein (1)

After charging nitrogen into a 1 L PE bottle, 300 g of DMAc, 57 g of PTFE powder (average particle diameter 0.1 to 2 um), 5.7 g of a polyester-based dispersant of polycaprolactone diol (Mn=2000), and 200 g of ball mill were introduced, and the mixture was agitated in a high speed ball mill equipment to disperse PTFE. After dispersion, 6FDA 4.49 g, PMDA 19.86 g, and TFDB 32.41 g were introduced into a PTFE-dispersed solution, and the mixture was agitated at 50° C. for 10 hours to react them, thus obtaining polyamic acid varnish with viscosity of about 15000 cps.

Example 2

Preparation of Polyamic Acid Varnish Including Fluoropolymer Powder Dispersed Therein (2)

Polyamic acid varnish was prepared by the same method as Example 1, except introducing 38 g of PTFE powder (average particle diameter 0.1 to 2 um).

Example 3

Preparation of Polyamic Acid Varnish

After introducing 200 g of DMAc into a 500 mL round-bottom flask, PMDA 12.07 g and BAPP 23.18 g were introduced, and the mixture was reacted while agitating using an agitator under flowing nitrogen at 50° C. for 10 hours, to obtain a polyamic acid solution with viscosity of 3,000 cps.

Example 4

Preparation of Single Side Flexible Metal Laminate

The polyamic acid varnish prepared in Example 3 was coated on a copper foil, and then, dried at 120° C. for 5 minutes, and on the dried polyamic acid varnish, the polyamic acid varnish including dispersed fluoropolymer prepared in Example 1 was coated, and dried at 120° C. for 10 minutes. And then, the polyamic acid varnish prepared in Example 3 was coated on the polyamic acid varnish including dispersed fluoropolymer, and dried at 120° C. for 10 minutes. And then, temperature was raised from room temperature in a nitrogen oven, and cured at 350° C. for 30 minutes to manufacture a single side flexible metal laminate.

Example 5

Manufacture of Double Side Flexible Metal Laminate

The polyamic acid varnish prepared in Example 3 was coated on a copper foil, and dried at 120° C. for 5 minutes, and on the dried polyamic acid varnish, the polyamic acid varnish including dispersed fluoropolymer prepared in Example 1 was coated, and dried at 120° C. for 10 minutes. And then, the polyamic acid varnish prepared in Example 3 was coated on the polyamic acid varnish including dispersed fluoropolymer, and dried at 120° C. for 10 minutes. And then, temperature was raised from room temperature in a nitrogen oven to cure at 350° C. for 30 minutes. And then, a new copper foil was laminated to a top polyimide layer formed by curing the top polyamic acid varnish at 350° C. using a roll laminator.

Figure 3:
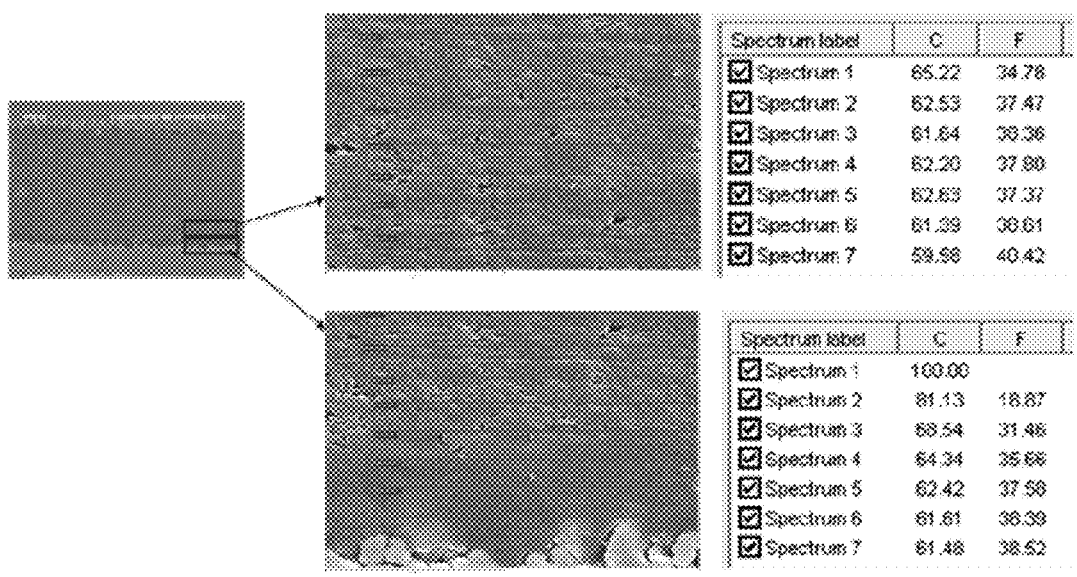
FIG. 3 shows a cross-section SEM photo and EDS results of the double side flexible copper clad laminate obtained in Example 5.
Figure 4:
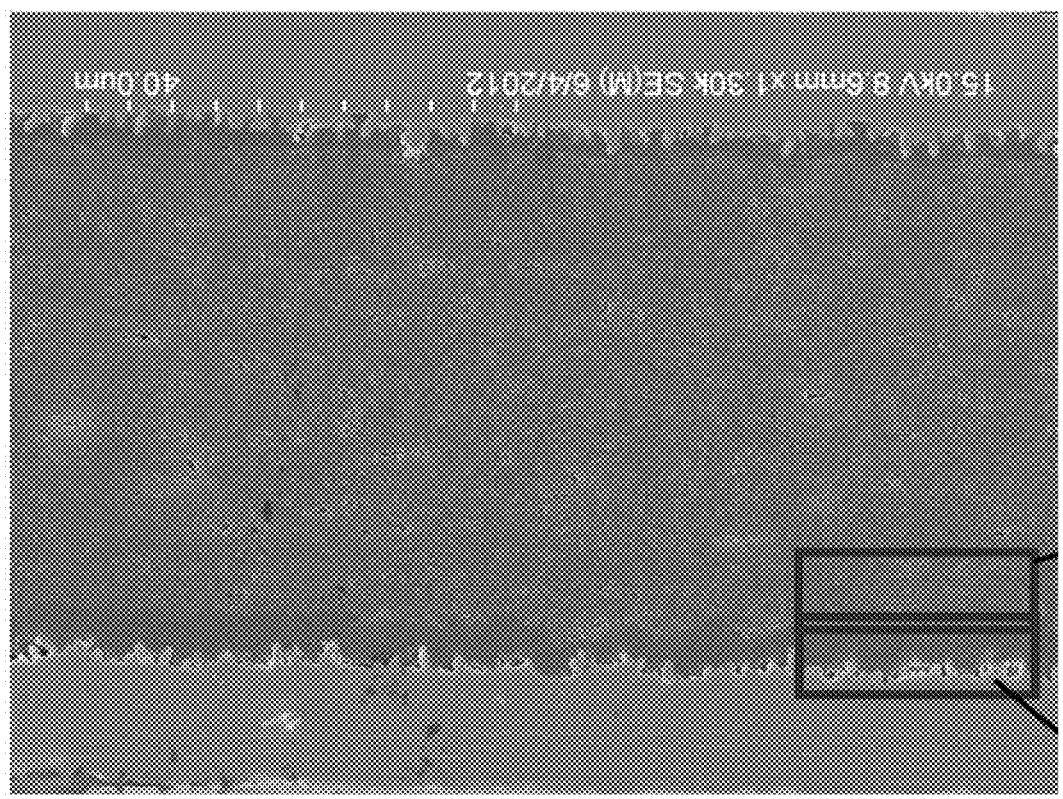
FIG. 4 is an enlarged view of the cross-section SEM photo of the laminate of FIG. 3.

The cross-section SEM photo and EDS result of the obtained double side flexible copper clad laminate are shown in FIG. 3. And, FIG. 4 is an enlarged view of the cross-section SEM photo of the laminate of FIG. 3.

Example 6

Manufacture of Double Side Flexible Metal Laminate (2)

The polyamic acid varnish prepared in Example 3 was coated on a copper foil, and dried at 120° C. for 5 minutes, and on the dried polyamic acid varnish, the polyamic acid varnish including dispersed fluoropolymer prepared in Example 2 was coated, and dried at 120° C. for 10 minutes. And then, the polyamic acid varnish prepared in Example 3 was coated on the polyamic acid varnish including dispersed fluoropolymer, and dried at 120° C. for 10 minutes. And then, temperature was raised from room temperature in a nitrogen oven to cure at 350° C. for 30 minutes. And then, a new copper foil was laminated to a top polyimide layer formed by curing the top polyamic acid varnish at 350° C. using a roll laminator.

Comparative Example 1

Preparation of Polyamic Acid Varnish (1)

Into a 500 mL round-bottom flask, DMAc 300 g, 6FDA 4.49 g, PMDA 19.86 g, and TFDB 32.41 g were introduced, and reacted while agitating under flowing nitrogen at 50° C. for 10 hours, to obtain polyamic acid varnish with viscosity of about 10000 cps.

Comparative Example 2

Preparation of Polyamic Acid Varnish (2)

Into a 500 mL round-bottom flask, DMAc 300 g, BPDA 31.16 g, and PDA 11.56 g were introduced, and reacted while agitating under flowing nitrogen at 50° C. for 10 hours, to obtain polyamic acid varnish with viscosity of about 14000 cps.

Comparative Example 3

Manufacture of Double Side Flexible Metal Laminate (1)

The polyamic acid varnish prepared in Example 3 was coated on a copper foil and dried at 120° C. for 5 minutes, and the polyamic acid varnish prepared in Comparative Example 1 was coated and dried at 120° C. for 10 minutes. And then, the polyamic acid varnish prepared in Example 3 was coated on the polyamic acid varnish prepared in Comparative Example 1, and dried at 120° C. for 10 minutes. And then, temperature was raised from room temperature in a nitrogen oven to cure at 350° C. for 30 minutes. And then, a new copper foil was laminated to a top polyimide layer formed by curing the top polyamic acid varnish at 350° C. using a roll laminator.

Comparative Example 4

Manufacture of Double Side Flexible Metal Laminate (2)

The polyamic acid varnish prepared in Example 3 was coated on a copper foil and dried at 120° C. for 5 minutes, and the polyamic acid varnish prepared in Comparative Example 2 was coated and dried at 120° C. for 10 minutes. And then, the polyamic acid varnish prepared in Example 3 was coated on the polyamic acid varnish prepared in Comparative Example 2, and dried at 120° C. for 10 minutes. And then, temperature was raised from room temperature in a nitrogen oven to cure at 350° C. for 30 minutes. And then, a new copper foil was laminated to a top polyimide layer formed by curing the top polyamic acid varnish at 350° C. using a roll laminator.

Dielectric constant, dielectric loss, water absorption rate, CTE, heat resistance, and peel strength of the metal laminates manufactured in Examples 4, 5, 6, and Comparative Examples 3, 4 were measured as follows.

(1) Measurement of Dielectric Constant, Dielectric Loss

Figure 2:
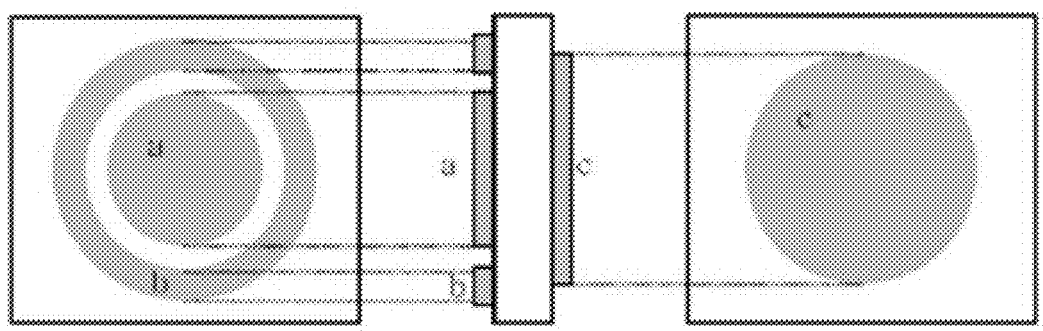
FIG. 2 shows a pattern shape of electrodes formed for measurement of dielectric constant and dielectric loss of a flexible metal laminate according to the present invention.

As shown in FIG. 2, the flexible metal laminate was patterned with a main electrode (a) with a diameter of 3 cm, earth electrode (b), and auxiliary electrode (c) with a diameter of 4 cm at 1 mm interval between the main electrode and earth electrode, and then, remaining copper foil part excluding the pattern was removed by etching, a specimen was cut to a size of 5×5 cm, and then, 1 MHz dielectric constant and dielectric loss were measured using L, C, R measuring device (Hewlett-Packard Company, HP4194A). In the case of a single side flexible metal laminate, silver paste was coated on (c), and then, cured at 150° C. for 30 minutes to form an auxiliary electrode (c), and the measurement was conducted (2) Measurement of Water Absorption Rate The copper foil of the flexible metal laminate was etched to completely remove, and then, the copper foil-removed polyimide film was cut to a size of 5×5 cm, and dried in an oven of 105° C. for 1 hour. The mass of the dried film was measured, and then, immersed in 23° C. distilled water for 24 hours. After 24 hours, moisture on the surface of the polyimide film was removed, and the mass of the polyimide film was measured and mass increment compared to dried film was calculated as percentage.

(3) CTE Measurement

Dimensional change was measured at a temperature interval of 100 to 200° C. using TMA equipment.

(4) Measurement of Peel Strength of Copper Foil

The copper foil was peed off with a width of 1 cm from the surface of the flexible metal laminate, and then, peel strength of copper foil was measured using tensile strength measuring device (UTM).

(5) Measurement of Heat Resistance

A sample cut to a size of 5×5 cm was mounted on a solder bath of 288° C., and then, standing time was measured.

The measurement result is as described in the following Table 1.

TABLE 1

| | Dielectric constant (Dk) | Dielectric loss (Df) | Water absorption rate (%) | CTE (ppm/K) | Peel strength (Kgf/cm) | Heat resistance (288° C.) |
|---|---|---|---|---|---|---|
| Example 4 | 2.53 | 0.0014 | 0.48 | 28 | 1.2 | Very excellent |
| Example 5 | 2.54 | 0.0015 | 0.55 | 28 | 1.2/1.3 | Very excellent |
| Example 6 | 2.72 | 0.0022 | 0.61 | 26 | 1.2/1.3 | Very excellent |
| Comparative Example 3 | 3.02 | 0.0041 | 1.52 | 20 | 1.2/1.4 | Excellent |
| Comparative Example 4 | 3.35 | 0.0043 | 1.96 | 18 | 1.4/1.4 | Excellent |

As shown in the Table 1, it can be seen that the flexible metal laminates manufactured in Examples 4, 5, and 6 have excellent dielectric constant and dielectric loss, compared to Comparative Examples 3 and 4. And, the flexible metal laminates manufactured in Examples 4, 5, and 6 have excellent heat resistance and optimized coefficient of thermal expansion, because fluoropolymer may be uniformly dispersed in a polyimide layer including dispersed fluoropolymer due to the use of a polyester-based dispersant.

Furthermore, as shown in FIGS. 3 and 4, it was confirmed that in the polyimide layer of the flexible copper clad laminate manufactured in Example 5, fluoropolymer is more distributed inside the resin compared to the external surface, and the content of fluoropolymer continuously increases to a certain depth from the polyimide layer surface of the flexible copper clad laminate, and is maintained beyond a certain depth.

And, from the water absorption rate and CTE, and the like, it can be seen that since the flexible metal laminate of the present invention has a structure wherein polyimide layers are formed on both sides of the polyimide layer including fluoropolymer powder dispersed therein, it may have increased adhesion to a copper foil layer and improved dielectric properties, and have low hygroscopicity while having properties of the existing polyimide insulator including high heat resistance, chemical resistance, high flexibility and dimensional stability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible metal laminate comprising
a first metal layer;
a first polyimide layer;
a monolithic polyimide layer including fluoropolymer dispersed therein, formed on the first polyimide layer; and
a second polyimide layer formed on the polyimide layer including fluoropolymer dispersed therein;
wherein in the monolithic polyimide layer including dispersed fluoropolymer, the content of the fluoropolymer per unit volume is higher at 40 to 60% depth than at 5 to 10% depth of the total thickness from the surface of the polyimide layer;
wherein the fluoropolymer is dispersed by using a polyester-based dispersant in the polyimide layer,
wherein the polyimide layers including the first polyimide layer, the monolithic polyimide layer including dispersed fluoropolymer, and the second polyimide layer have dielectric constant of 2.2 to 3.2 at 1MHz, dielectric loss of 0.001 to 0.007, and thermal expansion coefficient of 15 to 35 ppm/K,
wherein the first metal layer has a peel strength value of 1.2 to 1.3 Kgf/cm, and wherein the peel strength value is measured using a tensile strength measuring device for the flexible metal laminate that the metal was peeled off with a width of 1 cm from the surface.

2. The flexible metal laminate according to claim 1, wherein the monolithic polyimide layer including dispersed fluoropolymer has the lowest content of the fluoropolymer per unit volume at 5 to 10% depth of the total thickness from the surface of the polyimide layer.

3. The flexible metal laminate according to claim 1, wherein the monolithic polyimide layer including dispersed fluoropolymer has the highest content of the fluoropolymer per unit volume at 40 to 60% depth of the total thickness from the surface of the polyimide layer.

4. The flexible metal laminate according to claim 1, wherein in the monolithic polyimide layer including dispersed fluoropolymer, the content of the fluoropolymer per unit volume increases with depth, at 5 to 15% depth of the total thickness from the surface of the polyimide layer.

5. The flexible metal laminate according to claim 1, further comprising a second metal layer formed on the second polyimide layer.

6. The flexible metal laminate according to claim 5, wherein the surface of the first metal layer and the surface of the second metal layer respectively have ten point average roughness (Rz) of 0.5 to 2.5 μm.

7. The flexible metal laminate according to claim 1, wherein the first polyimide layer and the second polyimide layer respectively have a thickness of 1 to 10 μm.

8. The flexible metal laminate according to claim 1, wherein the monolithic polyimide layer including dispersed fluoropolymer has a thickness of 5 to 50 μm.

9. The flexible metal laminate according to claim 1, wherein the fluoropolymer is at least one selected from the group consisting of polytetrafluoroethylene (PTEF), perfluoroalkoxy (PFA), fluorinated ethylene propylene (FEP), chlorotrifluoroethylene (CTFE), tetrafluoroethylene/chlorotrifluoroethylene (TFE/CTFE), ethylene chlorotrifuloroethylene (ECTFE), and polyfluorinated vinylidene (PVDF).

10. The flexible metal laminate according to claim 1, wherein the fluoropolymer is included in the content of 10 to 60 wt % in the monolithic polyimide layer including dispersed fluoropolymer.

11. The flexible metal laminate according to claim 5, wherein the first metal layer and the second metal layer are films of one selected from the group consisting of copper, iron, nickel, titanium, aluminum, silver and gold, or an alloy of two or more kinds thereof.

* * * * *